United States Patent [19]
Natarajan

[11] Patent Number: 4,866,628
[45] Date of Patent: Sep. 12, 1989

[54] AUTOMATED PRODUCTION DISPATCH SYSTEM WITH FEEDBACK CONTROL

[75] Inventor: Bharath Natarajan, Marietta, Ga.

[73] Assignee: International Business Machines Corp., Armonk, N.Y.

[21] Appl. No.: 135,122

[22] Filed: Dec. 18, 1987

[51] Int. Cl.⁴ ............................................. G06F 15/46
[52] U.S. Cl. .................................... 364/468; 364/403; 364/513
[58] Field of Search ................ 364/468, 401, 402, 403, 364/552, 551.01, 578, 513, 200 MS File, 900 MS File

[56] References Cited

U.S. PATENT DOCUMENTS 3,698,766 10/1987 Entwistle et al. .................... 364/468
4,604,718 8/1986 Norman et al. .................. 364/468 X
4,644,480 2/1987 Haruna et al. ......................... 364/552
4,646,238 2/1987 Carlson et al. ........................ 364/403
4,648,023 3/1987 Powell ............................ 364/468 X Primary Examiner—Joseph Ruggiero
Attorney, Agent, or Firm—Whitham & Marhoefer

[57] ABSTRACT

A conceptual decision analysis tool for production dispatch process is used to evaluate alternatives during a production process and generate an optimum path to follow after a process disruption at a given production center in order to maintain the promised due date. The objective is not only to decide on a dispatch rule to be followed for an order under progress at a given work center in the event of a disruption, but also to re-analyze dispatch rules for existing orders waiting in line to be processed at that work center. In the event of production stoppage or disruption, this system analyzes the revised sequence for orders in progress as well as passes the recommended results to a planning system so that this information can be used to re-plan the release sequence of orders waiting for release. This provides a feedback control mechanism and an element of artificial intelligence.

7 Claims, 3 Drawing Sheets

PRODUCTION DISPATCH SYSTEM WITH FEEDBACK TO PRODUCTION RELEASE SYSTEM

AUTOMATED PRODUCTION DISPATCH SYSTEM WITH FEEDBACK CONTROL

CROSS REFERENCE TO RELATED APPLICATION

The subject matter of this application is related to that of my copending application Ser. No. 07/127,334 filed Dec. 1, 1987, for "Automated Production Release System", which is assigned to a common assignee herewith. The disclosure of application Ser. No. 07/127,334 is incorporated herein by reference.

BACKGROUND OF THE INVENTION

1. Field of the Invention

The present invention generally relates to a computer based production dispatch system on the manufacturing shop floor and, more particularly, to a system which automatically interfaces a production dispatch tool to a production planning system to provide an integrated approach to a manufacturing softward design. The invention provides an easy to use, user friendly interface for the shop foreman to dispatch orders in the most efficient way in the event of production stoppage at any point in the manufacturing process. This invention deals with released orders that have to be dispatched, whereas the invention of application Ser. No. 07/127,334 deals with the issue of planning and releasing orders prior to actual release.

2. Description of the Prior Art

The process of designing, developing and manufacturing a new product, or making major changes to existing products, presents many challenges to product managers and manufacturing managers to bring a product to market for the least cost, within schedule while maintaining product quality. In today's highly competitive industries, product managers and manufacturing managers require information to address many problems that arise because of the complexity of new products and the complexity of world-wide production and the changing nature of competition. The requirement that products be manufactured in as short a period as possible while maintaining a low level of inventory on the shop floor to meet customer needs presents conflicting criteria to be analyzed in order to make timely decisions.

Many authors have written books in the field of production management. For example, Joseph Orlicky wrote *Material Requirements Planning*, published by McGraw-Hill, which has become the industry standard reference for almost all job shop planning requirements. This concept of planning and releasing work to the manufacturing shop floor is well accepted and, even today, many vendors are selling software based on the concept. From a dispatching point of view, this system takes into account only the general concept of a first in, first out (FIFO) basis of dispatching. As mentioned in my copending application Ser. No. 07/127,334, D. T. Phillips and G. L. Hogg published a paper entitled "A State-of-the-Art Survey of Dispatching Rules for Manufacturing Job Shop Operation", *International Journal of Production Research*, vol. 20, no. 1, (1982) pp. 27–45, which provides varying dispatching rules that can be used in a planning process. IBM Corp. has a product called "Capacity Planning and Operation Sequencing System (CAPOSS)", described in Education Guide No. SR19-5004-0, that provides static dispatching functions in the form of deciding the next operation to be performed for an order after completion of a prior operation. This product provides the capability to change a dispatching process that is pre-assigned to another process. The limitation with this approach is that the system does not analyze the impact of a change to another operation. The system just provides the capability to change the operation and does not analyze the operational dynamics of one order affecting another in the downstream process. What is needed is an expert system that is simple to use and is user friendly to anaylze the dispatch decisions to be made and recommends the alternatives based on a given criteria; e.g., reduce the number of late orders or maximize throughput.

Expert systems are a branch of computer science, generally referred to as artificial intelligence, which exhibits characteristics normally associated with human behavior including learning, reasoning, solving problems and so forth. More specifically, an expert system or "knowledge based" system uses certain rules and a database to provide a user interactive environment in the form of a "consultation dialog", just as the user would interact with a human expert.

SUMMARY OF THE INVENTION

It is therefore an object of this invention to provide an easy to use system that takes a planned release of shop floor orders and, in the event of a production disruption, re-analyzes the planned release and recommends alternative dispatch rules based on current conditions.

It is another object of the invention to provide a system that prompts the production planner to alternate decision capabilities through graphic displays.

The automated production release system disclosed in my copending application Ser. No. 07/127,334 uses a set of order release and dispatch rules to meet certain management criteria of increased throughout, reduced cycle time and reduced work-in-process inventory and recommends a set of order release sequences to the manufacturing floor prior to actual release. The system according to the present invention is used after orders are released and production disruption is encountered on the shop floor. The key management criteria at such time would be to make sure orders are not late or, in the alternative, to minimize the tardiness of orders and reduce the manufacturing cycle time. Most of the material bought for the manufacturing process would already be on the shop floor. The system based on this invention analyzes current dispatch rules, using a simulation process, to determine if those rules will satisfy the management criteria of reducing cycle time and minimizing tardiness of shop orders. Based on the priority settings of orders, the system recommends the rule to be used. When such decisions have to be made and action taken, the information needs to be passed to the planning system so that the current status of the floor is used for future release of orders to the manufacturing floor.

The subject invention builds on the foundation of the automated production release system of my copending patent application Ser. No. 07/127,334, although the invention can be implemented and practiced independently. As mentioned above, this invention aims primarily at developing revised dispatch rules to be followed and the associated sequence of operations to be followed after a production disruption on the shop floor which causes re-analysis of the dispatching system. The approach taken by the invention is repeated interactively and forms what may be characterized as a "bottoms up" approach to feed information to the original planning process. More specifically, the system automatically creates a list of alternative processes that any production order can follow and establishes the optimum process flows in the event of a disruption on the manufacturing shop floor. The system automatically passes the information to the planning system which then recalculates the revised order release sequence for the remaining orders in the release process.

BRIEF DESCRIPTION OF THE DRAWINGS

The foregoing and other objects, aspects and advantages of the invention will be better understood from the following detailed description of a preferred embodiment of the invention with reference to the drawings, in which.

DETAILED DESCRIPTION OF A PREFERRED EMBODIMENT OF THE INVENTION

Figure 1:
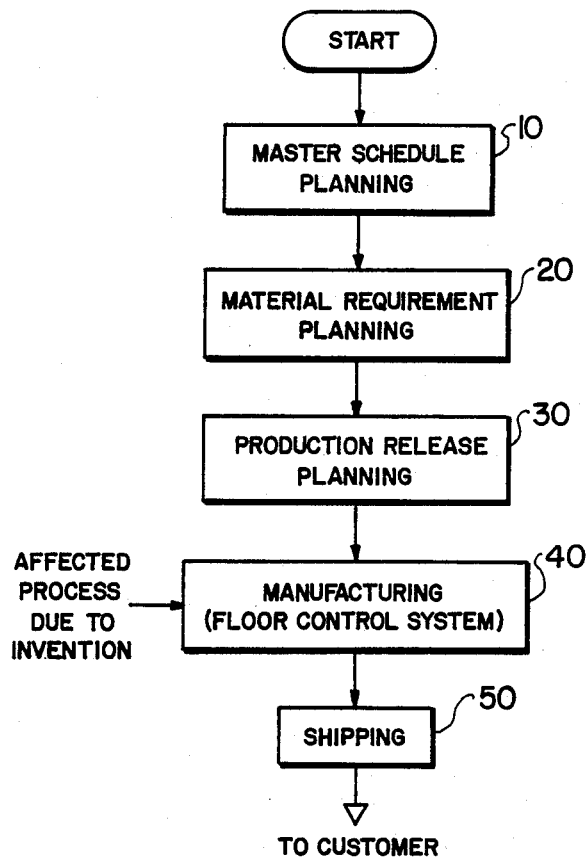
FIG. 1 is a system block diagram of the total manufacturing process from planning through execution.

Referring now to the drawings, and more particularly to FIG. 1, there is shown in functional block diagram form the normal set of processes that take place in a typical manufacturing environment from the time of planning through production and shipment. The key parts of this system includes the master schedule planning 10, where items are planned at the completed item level, the material requirement planning (MRP) system 20, where completed item requirements are exploded into sub-components and planned, and the production release system 30, where shop orders planned at the material requirement planning level are set for releasing to the shop floor. The production release system 30 is the subject of my copending patent application Ser. No. 07/127,334. The next part of the system, the manufacturing control system 40, is the process affected according to the present invention. This system monitors and analyzes the performance at the shop floor and provides signals to move items from one work center to another. The last block in the system is the shipping system 50 and is standard to any manufacturing enterprise.

Figure 2:
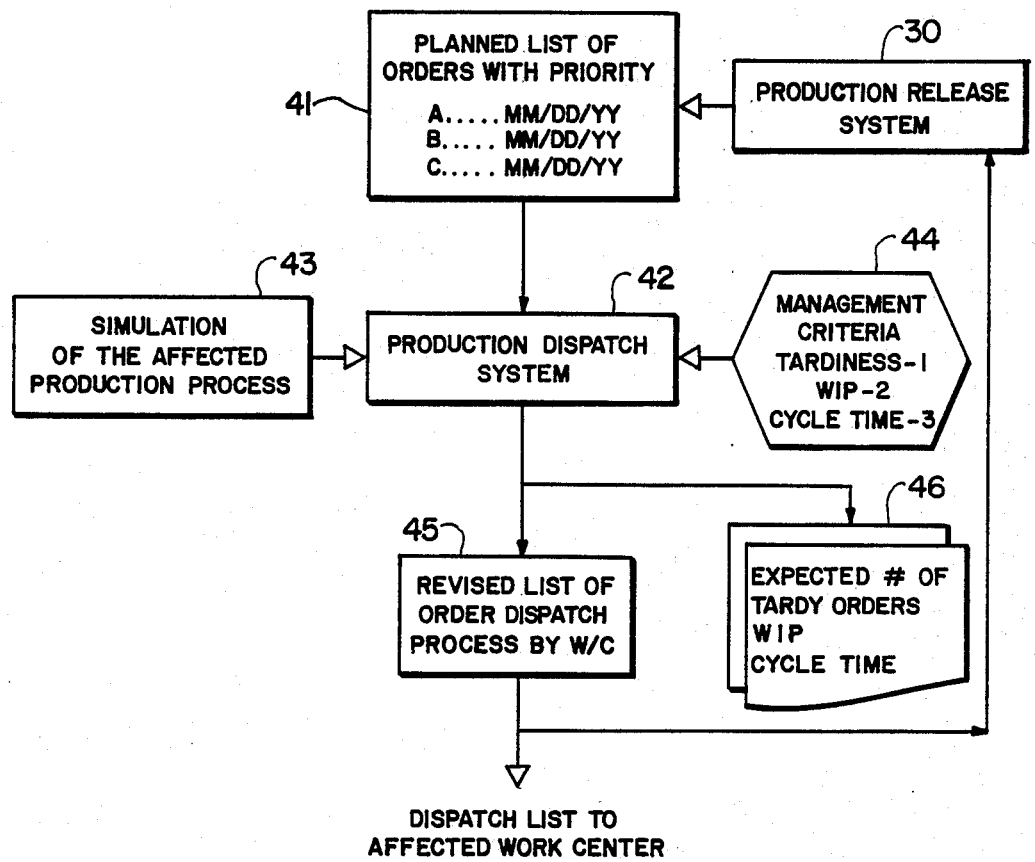
FIG. 2 is a block diagram that illustrates the dispatch system in detail and the interfaces to simulation system and production release system.

FIG. 2 illustrates the production dispatch system, which constitutes that part of the manufacturing control system 40 according to the present invention, and its relationship to the simulation and production release planning system 30. Here the list of orders and due dates 41 as received from the production release system 30 are monitored by the production dispatch system 42 to ensure that all dispatching is done as planned. In the event of a production disruption, the dispatch system 42 takes charge and decides the revised dispatch rule to be followed and the location for the item in the process to be sent. The system does this function by invoking the common function simulation system of the shop manufacturing floor 43. Using planned priority rules, as set out in List 1 below, and completed operations, an analysis is made to determine the effect of the production disruption. Based on the modified capacity and/or usage availability, the system performs calculations to determine if the original planned quantities and dates can be met. If not, the system prompts the user to input the priorities from among order tardiness, work-in-process inventory and cycle time. This is done by displaying the original management criteria priority as developed by the production planning system 30, and the user responds and provides input at block 44. Based on the revised priority input by the user, the production dispatch system 42 then re-calculates the dispatch rule to be followed together with the sequence to complete the work units and generates a recommended revised sequence and priorities in block 45 based on the results of the analysis. This information is then fed back to the production release system 30, providing the "bottoms up" approach to generating the planned list of orders 41. The system also automatically sets up management reports in block 46 which can be printed upon request.

LIST 1

Dispatching Rules:

(i) Shortest Imminent Operation Time (SI) is the rule that dispatches jobs that have a short processing time as opposed to long jobs. In order to have a limit on the maximum allowable time that a job can be waiting, this rule is often modified such that jobs with short processing times are released provided no other job in the queue is made to wait more than a given specified amount of time. This revised rule is often describes as SI/T (truncated) rule.

(ii) Earliest Due Date is the rule that dispatches jobs that have the earliest due dates.

(iii) First-in, First-out (FIFO) is the rule that dispatches jobs based on the order they arrive for processing.

(iv) Critical Ratio is the rule that dispatches jobs based on the ratio Time Remaining/Time Needed. The lesser the ratio, the more critical the job is and consequently gets a higher priority for dispatching.

While FIG. 2 illustrates that part of the manufacturing control system 40 according to the invention as self-contained, in the preferred embodiment of the invention, the system illustrated is actually integrated with the production planning system 30. More specifically, the common function simulation system 43 is shared with the production planning system 30. As described in more detail in my copending application Ser. No. 07/127,334, the simulation function 43 can be accomplished with a commercially available computer program marketed under the name of "GEMS II", a Generalized Manufacturing Simulator published by Loadestone-II, Inc. of Bryan, Texas. This software package has the natural orientation to modeling manufacturing environments. GEMS II is a network based technique such that its model is largely represented in a graphical format which resembles both manufacturing process flow diagrams and a PERT (Program Evaluation and Review Technique) chart. The model consists of boxes or nodes which, in general, represent various manufacturing and decision activities of the system, and arcs which show the procedural relationships among the activities. The logic of GEMS II recognizes queues (in-process inventories, production backlogs, etc.) and assembly processes. Further, it recognizes competition among activities for limited resources, such as tools, fixtures, space and manpower.

A more detailed description of the GEMS II simulation program is provided in my copending application Ser. No. 07/127,334. Those skilled in the art will, however, recognize that the simulation of the manufacturing system can be accomplished in a number of ways. The practice of the invention is not limited to any specific simulation program, and other programs may be used.

To illustrate the point that the system according to the invention can interface with any production release system, consider the COPICS (Communications Oriented Production Information Control System) product marketed by IBM Corp. Order release is a critical application in COPICS because it provides an interface between two main planning systems, inventory management and manufacturing activity planning, and between planning systems and execution systems. The COPICS product is described in publication G320-1978 by IBM Corp. In Chapter 7, volume V of that publication, order release is described as having two major conceptual parts: The functions to release shop orders for manufactured items, and the functions required to communicate the need for purchased items to the purchasing systems. The shop order release system as described in the COPICS publication addresses the functions required to release shop orders and establish the database records needed to maintain the information by which other systems will monitor and control the detailed feedback throughout the order. The system provides shop order reports with a list of open orders. Assuming this list or a similar list is sent to the manufacturing floor and the manufacturing process begins, the sequence of orders started would be displayed under the shop order generated by COPICS. In the event of a production disruption, the production dispatch system according to the invention, as stated earlier, would re-analyze the sequence and priority and re-set the sequence in order to meet the due dates or best reduce tardiness. The results would then be provided to the COPICS product as the production release system 30. Other similar systems marketed by MSA Corp. and Cullinet, for example, could also be used as the production release system 30. Nevertheless, the preferred embodiment of my invention contemplates an integration with the production release system of my copending application Ser. No. 07/127,334.

Figure 3:
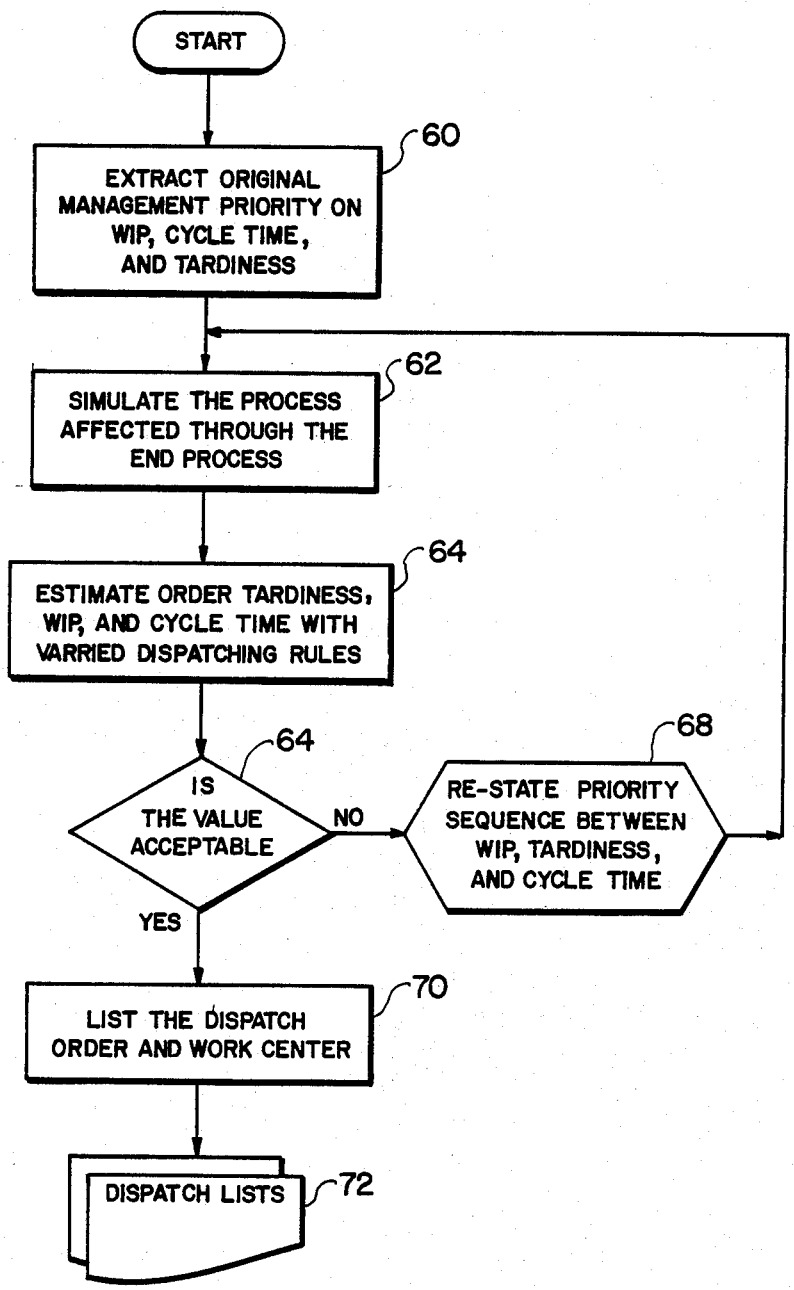
FIG. 3 is a flow chart that illustrates the logical flow of the decision process to arrive at a revised dispatch list in the event of a change in the state of the manufacturing process.

The logic of the process illustrated in FIG. 2 is shown by the flow chart of FIG. 3. With reference to FIG. 3, the process begins in function block 60 where the original management priority on work-in-process, cycle time and tardiness is extracted. The process is then simulated in function block 62 to determine how the process is affected through the end of the process. Based on the simulation, an estimate is made in function block 64 to order tardiness, work-in-process and cycle time with varied dispatching rules. This estimate is then tested in decision block 66 to determine if it is acceptable. The estimate would be considered acceptable, for example, if the original release schedule is not significantly affected by the production disruption. What is significant in each case could be a default value or a user input value. Thus, if only a slight slippage in scheduling work at the various work stations on the production floor is experienced, this might be considered acceptable.

If the estimate is not acceptable, the system prompts the user to re-state the priority sequence between work-in-process, tardiness and cycle time in operation block 68, and then control passes back to function block 62 to simulate the process again with the re-ordered priorities input by the user.

When the test made in decision block 66 is positive, that is the estimated value based on the simulation of the process is acceptable, then in function block 70 the dispatch orders and work centers are ordered in a list, and the dispatch list is printed at 72.

Figure 4:
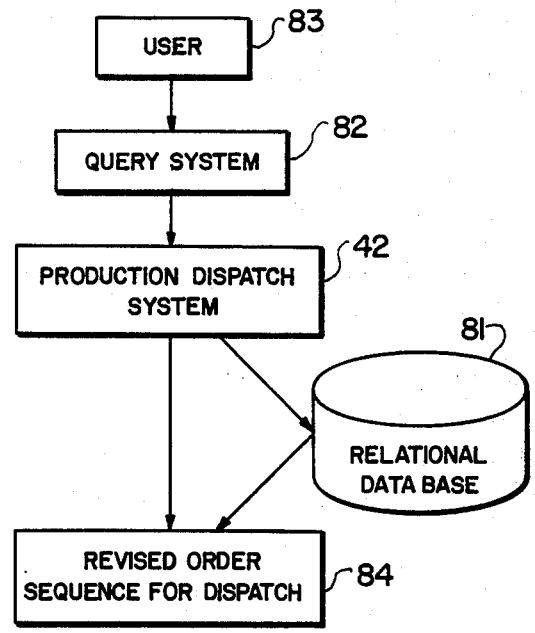
FIG. 4 is a block diagram that illustrates the relative position of the user with respect to the production dispatch system and a relational database.

FIG. 4 illustrates the key parts of the system from the user point of view. The key parts are the database 81 and the query system 82. The database can be any of several products currently available, but for purposes of the preferred embodiments, IBM's DataBase 2 (DB2) is used. DB2 is a relational database system, but it will be understood by those skilled in the art that other databases, including hierarchical databases, could be used. General information on IBM's DB2 can be has with reference to publication GC26-4073-2 published by IBM Corp. The query system can be an expert system, but for purposes of the preferred embodiment of this invention, IBM's Restructured EXtended eXecutor (REXX) language is used. A description of the REXX language is provided in "Virtual Machine/Systems Product, System Product Interpreter User's Guide", Release 4, publication SC24-5238-2 published by IBM Corp.

The user 83 can query the current status, completion date and the priority sequence of any job in question using the query system 82. The query system 82 interfaces with the production dispatch system 42 which accesses database 81 and provides the revised dispatch sequence to be followed. The database 81 as defined has the capability to capture the decision variables tested and the results obtained for each test. The user can access the results using the query facility at a later date, if needed, and obtain an output in the form of a revised order sequence for dispatch in block 84. This enhances the analysis capability of future test data. This also provides an additional enhancement to the system.

When a disruption occurs in the production process, the operations manager is very concerned about the expected completion time of the order that has been affected as well as the impact on other orders on the shop floor. He or she would also be concerned with the excessive work-in-process inventory and the cycle time needed to complete all orders on the shop floor. This dispatch system gives the manager the needed capability to recover from the situation, if possible, or the best alternative. Having taken a course of action as analyzed by the production dispatch system, the planning system and production release system need to be informed of the revised plan and status of the operation centers in order to effectively plan future orders. This is an added enhancement to this system.

This decision making capability of the dispatch system based on user defined rules and objectives provides the artificial intelligence of the system.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. An automated production dispatch system for implementation on a computer, said system providing for the dispatch information for a manufacturing environment to aid a user to make decisions that will improve the dispatch process, comprising the steps of:

monitoring production release and dispatch orders generated by a production planning process;

simulating the manufacturing environment subject to a production disruption based on defined management dispatch criteria to generate an estimate of order tardiness, work-in-process inventory and cycle time; and testing the estimate to determine if the estimate is acceptable according to predefined criteria.

2. The automated production dispatch system as recited in claim 1 wherein if the estimate is not acceptable, performing the steps of:

prompting the user to define dispatch priorities between minimizing order tardiness, minimizing work-in-process inventory and minimizing manufacturing cycle time; and generating revised dispatch sequence of dispatch orders for the manufacturing environment.

3. The automated production dispatch system as recited in claim 2 wherein said computer includes a database and a query system and further comprising the steps of:

capturing in said database decision variables generated in said step of simulating;

responding to a user input via the query system to access the decision variables captured in the database; and displaying an analysis of tested combinations of the tested alternatives in the production release.

4. The automated production dispatch system as recited in claim 3 further comprising the step of responding to a user input via the query system to select a decision rule and evaluate the tested alternatives on the management criteria of order tardiness, work-in-process inventory and cycle time.

5. The automated production dispatch system as recited in claim 4 further comprising the step of displaying management criteria defined by the user correlated with said revised sequence of dispatch orders.

6. The automated production dispatch system as recited in claim 2 further comprising the steps of:

providing an option to the user of changing said management dispatch criteria to make a new set of dispatch rules; and performing said simulating step according to said new set of dispatch rules.

7. The automated production dispatch system as recited in claim 6 wherein said computer includes a database and a query system and further comprising the steps of:

capturing in said database decision variables generated in said step of simulating;

responding to a user input via the query system to access the decision variables captured in the database; and displaying an analysis of tested combinations of the tested alternatives in the production dispatch system.

* * * * *